(12) United States Patent
Yu et al.

(10) Patent No.: US 8,043,875 B2
(45) Date of Patent: Oct. 25, 2011

(54) LED PACKAGING METHOD

(75) Inventors: Tai-Cherng Yu, Taipei Hsien (TW);
Han-Lung Lee, Taipei Hsien (TW)

(73) Assignee: Hon Hai Precision Industry Co., Ltd.,
Tu-Cheng, New Taipei (TW)

( * ) Notice: Subject to any disclaimer, the term of this
patent is extended or adjusted under 35
U.S.C. 154(b) by 0 days.

(21) Appl. No.: 12/770,962

(22) Filed: Apr. 30, 2010

(65) Prior Publication Data

US 2011/0151604 A1    Jun. 23, 2011

(30) Foreign Application Priority Data

Dec. 23, 2009   (TW) .............................. 98144349 A

(51) Int. Cl.
*H01L 33/48* (2010.01)
(52) U.S. Cl. ............... 438/27; 438/26; 438/28; 438/34; 977/742; 257/E33.056

(58) Field of Classification Search .................... 438/26, 438/27, 28, 34; 977/742
See application file for complete search history.

(56) References Cited

U.S. PATENT DOCUMENTS

| | | | |
|---|---|---|---|
| 2007/0181906 A1* | 8/2007 | Chik et al. | 257/103 |
| 2008/0093975 A1* | 4/2008 | Ryu et al. | 313/496 |
| 2009/0061550 A1* | 3/2009 | Kim et al. | 438/27 |
| 2009/0072229 A1* | 3/2009 | Suh et al. | 257/40 |
| 2009/0184389 A1* | 7/2009 | Bertin et al. | 257/476 |
| 2009/0246901 A1* | 10/2009 | Gilet et al. | 438/29 |
| 2010/0171143 A1* | 7/2010 | Paek et al. | 257/99 |

* cited by examiner

*Primary Examiner* — Alexander Ghyka
(74) *Attorney, Agent, or Firm* — Altis Law Group, Inc.

(57) ABSTRACT

An LED packaging method provides a package that includes a substrate, a LED chip, a carbon naonotube thin film and an adhesive layer. The LED chip includes an anode and a cathode. The carbon naonotube thin film includes at least two electrically conductive areas spaced from each other. The anode and the cathode are electrically connected to the adjacent electrically conductive areas. The adhesive layer is coated on the LED chip and the carbon nanotube thin film.

9 Claims, 4 Drawing Sheets

LED PACKAGING METHOD

BACKGROUND

1. Technical Field

The present disclosure relates to LED manufacture, and particularly, to an LED packaging method.

2. Description of the Related Art

Light emitting diodes (LED) have enjoyed increasingly widespread application, for example, in the automotive industry, as a display or signal indictor, and continue to do so. As LED brightness increases, however, the heat generated thereby increases correspondingly. Hence, the heat dissipation capability and luminous efficiency of the LED package become very important, especially regards to the successful packaging of the LED chips.

A frequently used LED package includes a substrate, an electrically conductive layer, an adhesive layer, a LED chip, two gold wires, a metal base and a glass lens. A back surface of the substrate includes a plurality of wiring lines and bonding pads. Meanwhile, the electrically conductive layer is formed on a front surface of the substrate by plating copper or silver. The LED chip is electrically connected to the electrically conductive layer via the two gold wires. The metal base is disposed on the substrate, and the LED chip is received in the metal base. The surface of the metal base is fully plated with silver. The glass lens covers the metal base. However, the electrically conductive layer comprises copper or silver material, with heat conductivity thereof about 380 W/m·K, such that the heat dissipation capability of the LED package is less than optimum. Furthermore, with the LED chip received in the metal base, heat dissipation capability of the entire LED package is decreased.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
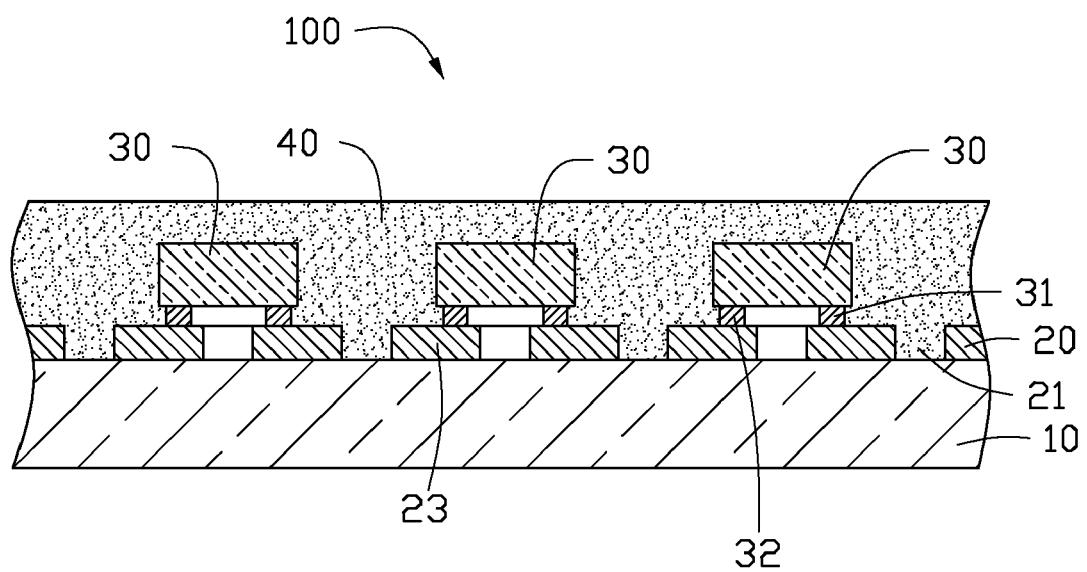
FIG. 1 is an isometric cross-section of an LED package manufactured using a first embodiment of an LED packaging method.

Referring to FIG. 1, an LED package 100 manufactured using a first embodiment of an LED packaging method includes a substrate 10, a carbon nanotube thin film 20, at least two LED chips 30 and an adhesive layer 40. The carbon nanotube thin film 20 is formed on the substrate 10. The carbon nanotube thin film 20 defines a plurality of elongated grooves 21 dividing at least four electrically conductive areas 23. The at least four electrically conductive areas 23 are spaced from each other. Each LED chip 30 includes an anode 31 and a cathode 32. The anode 31 and cathode 32 are electrically connected to the adjacent electrically conductive areas 23, respectively. The adhesive layer 40 includes fluorescent powders dispersed inside the adhesive layer 40. The adhesive layer 40 is coated on the carbon nanotube thin film 20, and completely covers the LED chips 30. In the illustrated embodiment, the substrate 10 is made of a ceramics material.

The LED package 100 can be use for an LED array. In an alternative embodiment, the LED package 100 can be cut into a plurality of single LED chip packages.

A heat conductivity of a carbon nanotube along an axial direction is more than 6600 W/m·K, such that the heat dissipation capability of LED package 100 is increased. The electrically conductive areas 23 can be formed during a process of making the carbon nanotube thin film 20, as a result, the LED package 100 is thereby easily fabricated without the need to plate an electrically conductive layer. The adhesive layer 40 substantially fills inside the elongated grooves 21 of the carbon nanotube thin film 20, such that the electrically conductive areas 23 are insulated from each other, and the LED chips 30 and the carbon nanotube thin film 20 are tightly fixed on the substrate 10.

Figure 2:
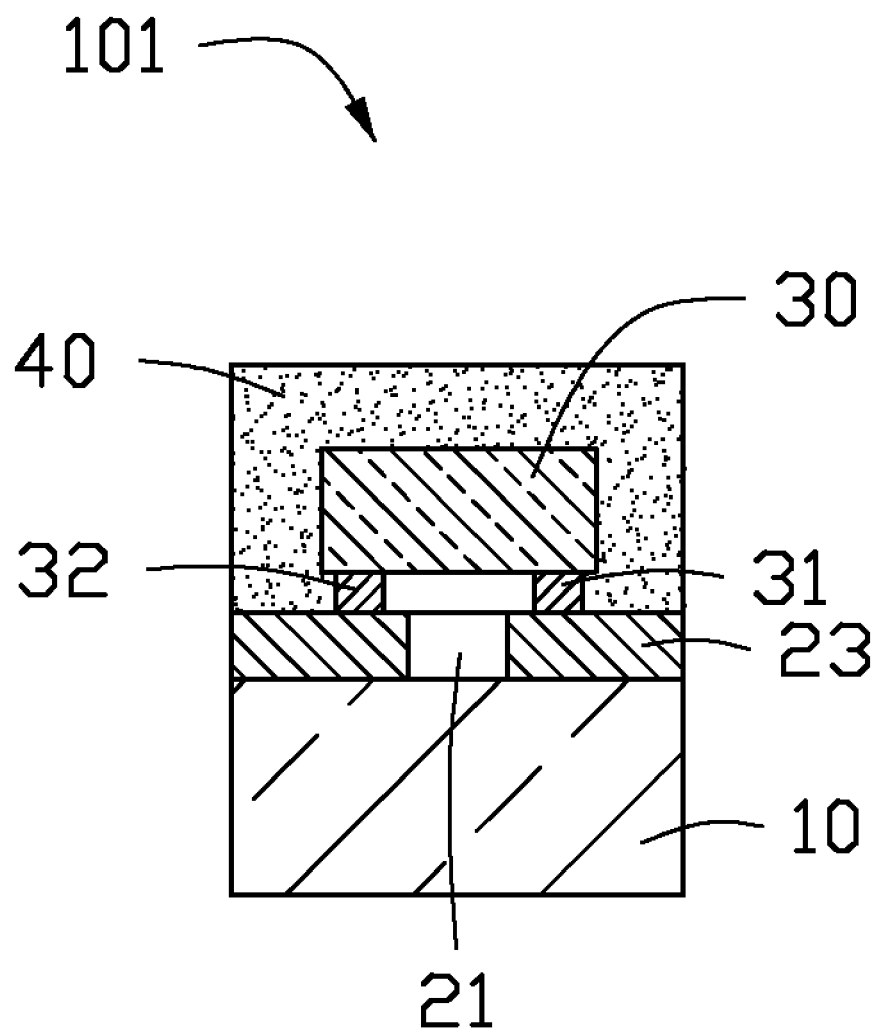
FIG. 2 is an isometric cross-section of an LED package manufactured using a first embodiment of an LED packaging method.

Referring to FIG. 2, an LED package 101 manufactured using a second embodiment of an LED packaging method is shown, and differing from the first embodiment only in that the LED package 101 has only one LED chip 30. The carbon nanotube thin film 20 defines an elongated groove 21 dividing two electrically conductive areas 23. The anode 31 and the cathode 32 of the LED chip 30 are electrically connected to the adjacent electrically conductive areas 23, respectively.

Figure 3:
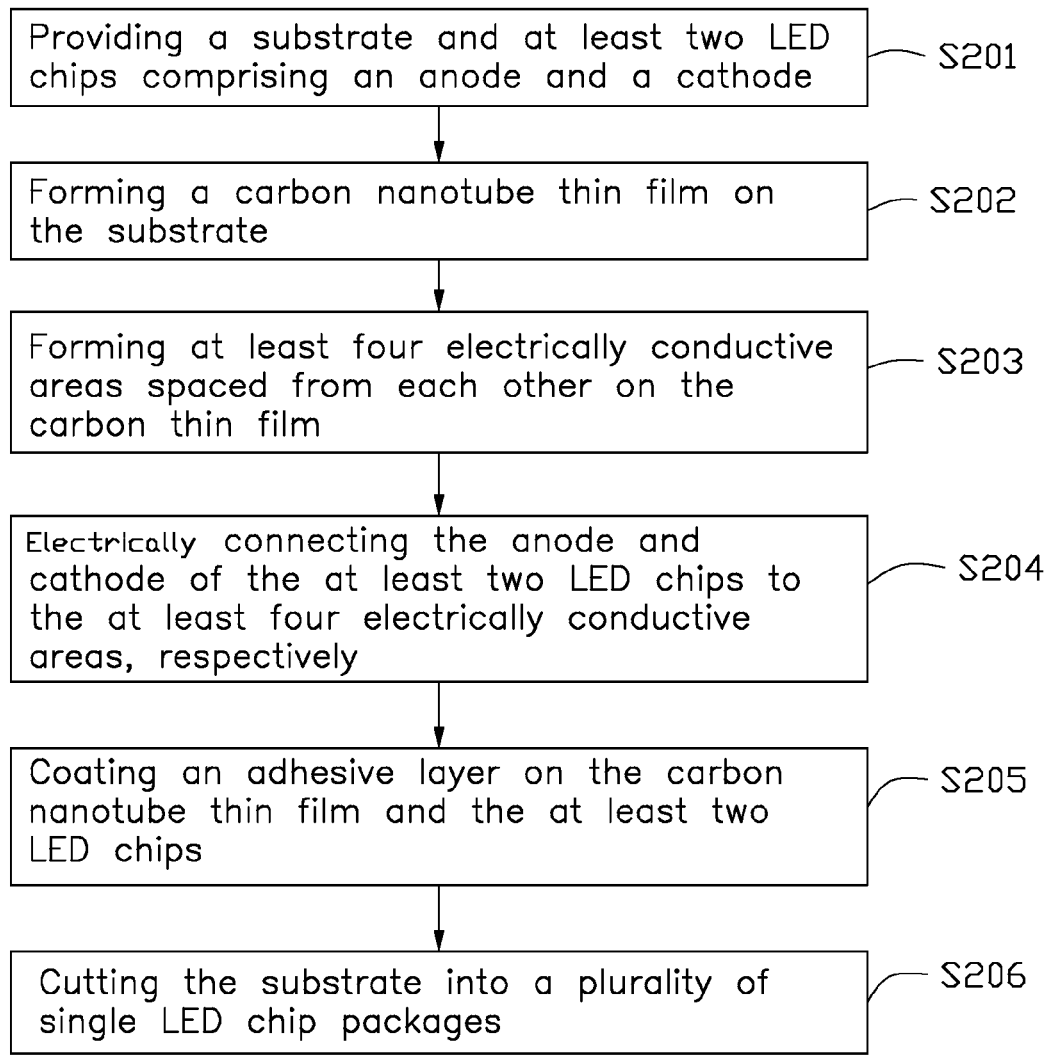
FIG. 3 is a flowchart of the first embodiment of an LED packaging method.

Referring to FIGS. 1 and 3, a first embodiment of an LED packaging method includes the following.

In step S201, a substrate 10 and at least two LED chips 30 are provided. Each LED chip 30 includes an anode 21 and a cathode 32. The substrate 10 is a ceramic substrate or anodic oxidized aluminium substrate.

In step S202, a carbon nanotube thin film 20 is formed on the substrate 10.

In step S203, the carbon nanotube thin film 20 forms at least four electrically conductive areas 23 spaced from each other on the carbon nanotube thin film 20. The carbon nanotube thin film 20 defines a plurality of elongated grooves 21 dividing the at least four electrically conductive areas 23 by laser hole drilling or selective heating. The elongated grooves 21 are defined between the at least four electrically conductive areas 23.

In step S204, the anodes 21 and the cathodes 32 of the at least two LED chips 30 are electrically connected to the at least four electrically conductive areas 23, respectively.

In step S205, an adhesive layer 40 is coated on the carbon nanotube thin film 20 and the at least two LED chips 30. The adhesive layer 40 includes fluorescent powders dispersed inside the adhesive layer 40.

In step S206, the substrate 10 is cut into a plurality of single LED packages 101.

It is to be understood that step 206 can be omitted when the LED package 100 is required to be manufactured for fabricating an LED array.

Figure 4:
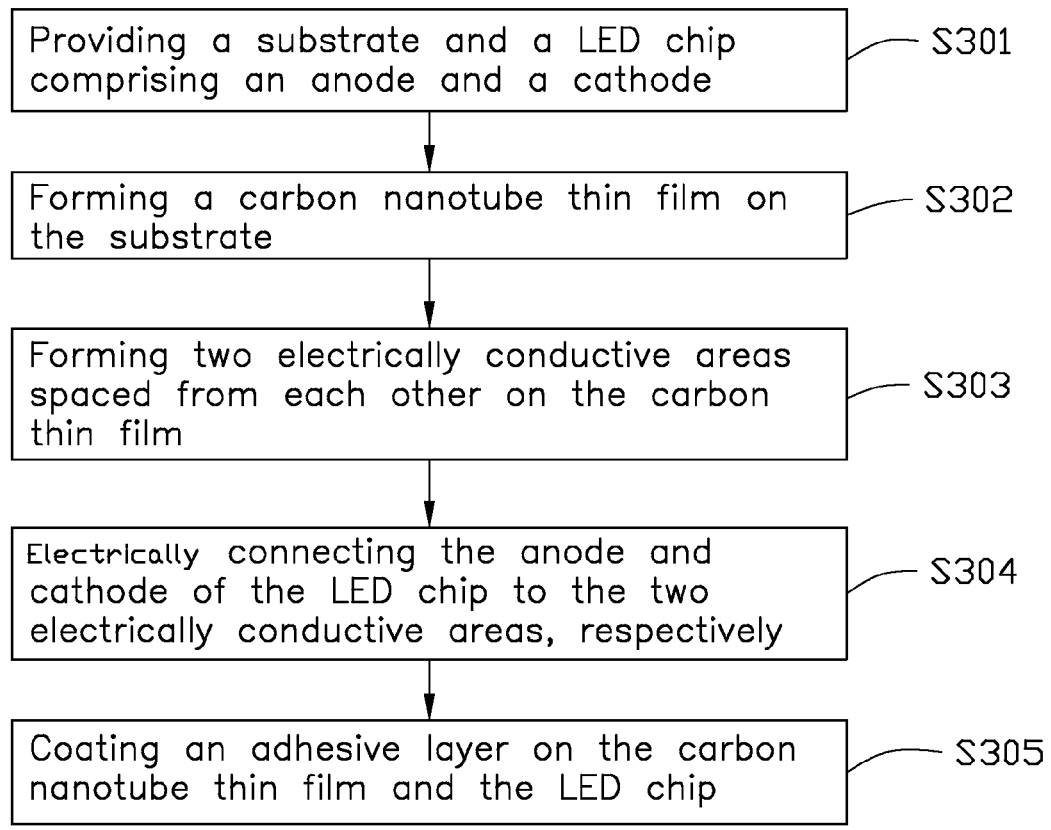
FIG. 4 is a flowchart of the second embodiment of an LED packaging method.

Referring to FIGS. 2 and 4, a second embodiment of an LED packaging method includes the following.

In step S301, a substrate 10 and one single LED chip 30 are provided. The LED chip 30 includes an anode 21 and a cathode 32. The substrate 10 is a ceramic substrate or an anodic oxidized aluminium substrate.

In step S302, a carbon nanotube thin film 20 is formed on the substrate 10.

In step S303, the carbon nanotube thin film 20 forms two electrically conductive areas 23 spaced from each other on the carbon nanotube thin film 40. The carbon nanotube thin film 20 defines a plurality of elongated grooves 21 dividing the two electrically conductive areas 23 by laser hole drilling or selective heating.

In step S304, the anodes 21 and the cathodes 32 of the LED chip 30 are electrically connected to the two electrically conductive areas 23, respectively.

In step S305, an adhesive layer 40 is coated on the carbon nanotube thin film 20 and the LED chip 30.

Finally, while the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure as defined by the appended claims.

What is claimed is:

1. An LED packaging method comprising:
   providing a substrate and at least two LED chips comprising an anode and a cathode;
   forming a carbon nanotube thin film on the substrate;
   forming at least four electrically conductive areas spaced from each other on the carbon nanotube thin film;
   electrically connecting the anode and cathode of the at least two LED chips to the at least four electrically conductive areas, respectively; and
   coating an adhesive layer on the carbon nanotube thin film and the at least two LED chips.

2. The LED packaging method of claim 1, wherein the substrate is a ceramic substrate or an anodic oxidized aluminium substrate.

3. The LED packaging method of claim 1, wherein the carbon nanotube thin film defines a plurality of elongated grooves between the electrically conductive areas by laser hole drilling or selective heating.

4. The LED packaging method of claim 1, further comprising cutting the substrate into a plurality of single LED packages.

5. The LED packaging method of claim 1, wherein the adhesive layer comprises fluorescent powder dispersed inside the adhesive layer.

6. An LED packaging method comprising:
   providing a substrate and one LED chip comprising an anode and a cathode;
   forming a carbon nanotube thin film on the substrate;
   forming two electrically conductive areas spaced from each other on the carbon nanotube thin film;
   electrically connecting the anode and cathode of the LED chip to the two electrically conductive areas, respectively; and
   coating an adhesive layer on the carbon nanotube thin film and the LED chip.

7. The LED packaging method of claim 6, wherein the substrate is a ceramic substrate or an anodic oxidized aluminium substrate.

8. The LED packaging method of claim 6, wherein the carbon nanotube thin film defines an elongated groove between the electrically conductive areas by laser hole drilling or selective heating.

9. The LED packaging method of claim 6, wherein the adhesive layer comprises fluorescent powder dispersed inside the adhesive layer.

* * * * *